United States Patent

Ohara et al.

Patent Number: 5,259,015
Date of Patent: Nov. 2, 1993

[54] ROTARY ANODE FOR X-RAY TUBE AND METHOD FOR MANUFACTURING THE SAME

[75] Inventors: Hisanori Ohara; Hiromu Kawai, both of Itami; Shigehiko Takaoka; Yasuhiro Katoh, both of Tokyo, all of Japan

[73] Assignees: Sumitomo Electric Industries, Ltd.; Tokyo Tungsten Co., Ltd., Tokyo, both of Japan

[21] Appl. No.: 882,026

[22] Filed: May 13, 1992

[30] Foreign Application Priority Data

May 17, 1991 [JP] Japan .................................. 3-142457

[51] Int. Cl.$^5$ .............................................. H01J 35/10
[52] U.S. Cl. .................................... 378/144; 378/143; 378/127
[58] Field of Search ............... 378/144, 143, 119, 121, 378/125, 127, 128, 129; 428/634, 665; 427/250

[56] References Cited

U.S. PATENT DOCUMENTS 4,920,012  4/1990  Woodruff et al. .................. 378/144

Primary Examiner—David P. Porta
Attorney, Agent, or Firm—Wenderoth, Lind & Ponack

[57] ABSTRACT

A rotary anode for use in an X-ray tube has a graphite substrate plate, an intermediate layer made of a metal that does not react with graphite, and an X-ray generating layer provided on the intermediate layer for generating X-rays when electron impact is applied. The intermediate layer is a rhenium film having an equiaxed grain structure. A method for manufacturing such a rotary anode is proposed. The method has the step of forming, on a graphite substrate plate, an intermediate layer of rhenium by subjecting a metallic chloride to the thermal decomposition CVD process at a substrate temperature of 1200° C. or more. The method further has the step of forming, on the intermediate layer, an X-ray generating layer of tungsten or tungsten-rhenium alloy by subjecting a metallic fluoride to the hydrogen reduction thermal CVD process.

2 Claims, 2 Drawing Sheets

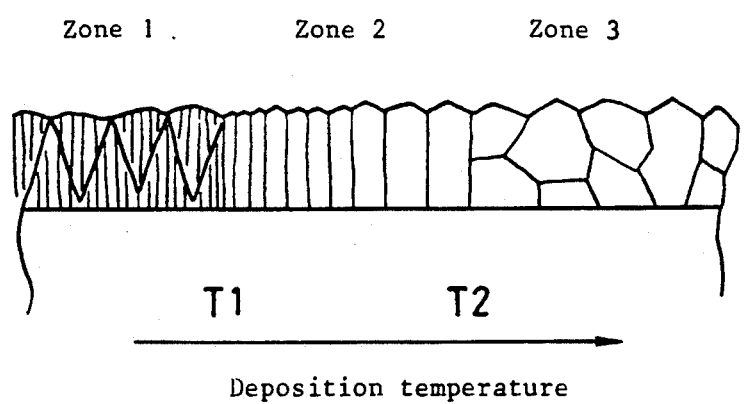

ROTARY ANODE FOR X-RAY TUBE AND METHOD FOR MANUFACTURING THE SAME

BACKGROUND OF THE INVENTION

The present invention relates to a rotary anode for use in a rotary anode type X-ray tube which is required to have a high X-ray output and a method for manufacturing the rotary anode.

With the increasing performance of medical equipment such as an X-ray CT, a more powerful X-ray output is required. Thus, a large heat capacity as well as light weight is required for a rotary anode for use in an X-ray tube. In order to attain this purpose, it has been proposed to employ, in place of a rotary anode made of metal only, a structure comprising a graphite substrate and an X-ray generating metal plate bonded to the substrate or a graphite substrate plated with an X-ray generating metal.

The former structure in which an X-ray generating metal plate is bonded to a graphite substrate is made by bonding an X-ray generating metal plate produced to the graphite substrate plate by brazing or the like (first prior art method). In the latter structure comprising a graphite substrate plated with an X-ray generating layer, the X-ray generating layer is formed by chemical vapor deposition on the graphite substrate, for example, as disclosed in Japanese Patent publication 47-8263 (second prior art method). The publication also teaches the formation of an intermediate layer of rhenium as a diffusion shield to prevent mutual diffusion between tungsten, the best material as an X-ray generating layer, and the graphite substrate. Further, it is known to add rhenium to tungsten to prevent the X-ray generating intensity from dropping. Further, as disclosed in Japanese Unexamined Patent Publication 59-8252, it is known to subject the assembly to heat treatment in a non-oxidizing atmosphere after forming the intermediate layer and the X-ray generating layer by the second prior art method to form alloy layers between the adjacent layers and thus to improve adhesion between layers (third prior art method).

But the first prior art method has a problem in that the bonding of the X-ray generating metal plate is unstable. Further the metal plate has to be made unnecessarily thick for structural reasons, so that the weight of the entire rotary anode cannot be markedly reduced.

The second prior art method is advantageous over the first prior art method in that a good adhesion is achieved between the graphite substrate and the X-ray generating layer, so that the thickness of the X-ray generating layer having a large specific gravity can be reduced to a minimum. But since the intermediate layer of rhenium has a columnar grain structure, mutual diffusion tends to occur between the tungsten and the graphite substrate. Such diffusion will cause the formation of brittle tungsten carbide under the X-ray generating layer. This may in turn cause reduced X-ray output or peeling or cracking of the X-ray generating layer. Thus this method is not suitable for prolonged use.

With the third prior art method, a tungsten carbide layer is formed under the X-ray generating layer during the heat treatment step. Thus, this method cannot offer an effective solution to the problems encountered by the second method.

SUMMARY OF THE INVENTION

The present invention provides a rotary anode for use in an X-ray tube and a method for manufacturing the same, which obviates the above problems. More specifically, a rotary anode for use in an X-ray tube is provided comprising a graphite substrate plate, an intermediate layer made of a metal that does not react with graphite, and a generating layer provided on the intermediate layer for generating X-rays when an electron impact is applied, characterized in that the intermediate layer is a rhenium film having an equiaxed grain structure. Also a method for manufacturing a rotary anode for use in an X-ray tube is provided, comprising the steps of forming, on a graphite substrate plate, an intermediate layer of rhenium by subjecting a metallic chloride to the thermal decomposition CVD process at a substrate temperature of 1200° C. or more, and forming, on the intermediate layer, a generating layer of tungsten or tungsten-rhenium alloy by subjecting a metallic fluoride to the hydrogen reduction thermal CVD process.

First, we shall explain the reason why the rhenium film as the intermediate layer has to have an equiaxed grain structure. For purpose of this invention, the term "equiaxed grain structure" is used as having an aspect ratio of the grain nearly equal to one. The deposition temperature during the deposition process such as the CVD process is closely associated with the structure of the film obtained. This fact is reported in several publications. As shown in FIG. 3, a columnar structure appears (zone 2) at comparatively low temperatures and an equiaxed grain structure appears (zone 3) at high temperatures. The temperature $T_2$ (in absolute temperature K) at which transition from the columnar structure to the equiaxed grain structure occurs is about half of the melting temperature Tm (in absolute temperature K) of the metal used ($T_2/Tm = 0.45$ to be precise). If rhenium is used, since its melting temperature is 3180° C. (3453° K.), $T_2$ is about 1281° C. (1554° K.).

Actually, however, the equiaxed grain structure appeared at a temperature slightly lower than this temperature (1200° C. in the present invention). It was observed that carbon diffuses through a rhenium film having an equiaxed grain structure at a slower speed than through a rhenium film having a columnar structure. This is due to the fact that the diffusion of carbon through the grain boundary of a columnar structure (grain boundary diffusion) is faster than the diffusion of carbon inside the crystal grain (bulk diffusion), i.e. due to the fact that the diffusing distance through the grain boundary of an equiaxed grain structure is longer than that through the grain boundary of a columnar structure. Also, even if two materials have the same columnar structure, the smaller the grain diameter in the columnar structure, the greater the number of diffusion paths and thus the greater amount of carbon moves by diffusion.

On the other hand, it is known that the life of a rotary anode having an X-ray generating layer containing tungsten as a main substance on the graphite substrate can shorten if the carbon that diffuses through the rhenium intermediate layer reacts with the tungsten to form tungsten carbide and this causes peelings and cracking in the X-ray generating layer. Therefore, a rotary anode for use in an X-ray tube which withstands long use can be obtained if a rhenium film having an equiaxed grain structure is formed as the intermediate layer or diffusion shield to restrain carbon diffusion according to the present invention.

Next, as a method of forming the rotary anode according to the present invention, the intermediate layer is formed from a rhenium chloride by the thermal decomposition CVD. This is to achieve the following merits.

First, the thermal decomposition reaction offers higher activation energy than the hydrogen reduction method. Thus, the reaction occurs at higher temperature and a finer film is obtainable. For example, a fluoride gas was frequently used in the hydrogen reduction method because of relative easiness in handling a material gas. But with this method, since the reaction starts at an extremely low temperature, about 300° C., the density of the film obtained tends to be low. In contrast, by subjecting a chloride to thermal decomposition, the film density never drops even if the board temperature is increased to 1200° C. or more.

The second merit is that the rhenium film thus made has larger crystal grains and an equiaxed grain structure. We have already explained why and how a rhenium film having an equiaxed grain structure has excellent properties as a diffusion shield.

The third merit is a low production cost. A rhenium film can be formed from a rhenium fluoride. But a rhenium fluoride is very expensive. According to the present invention, a cheap rhenium chloride is used. For example, as described in Japanese Unexamined Patent Publication 58-100669, by synthesizing (chlorinating) rhenium chloride from relatively cheap materials, that is, metallic rhenium and chlorine gas in a chlorinating oven provided upstream of the CVD reactor and then decomposing it in the CVD reactor provided downstream thereof, the yield of the material improves greatly.

The X-ray generating layer is formed from a metallic fluoride by hydrogen reduction. This is because this method is suitable for forming a film made up of fine crystal grains. Since the tungsten as the main substance in the generating layer is heated to 1000° C. or more by electron impact, it recrystallizes gradually and its ductility drops. It is known that such drop in ductility can be prevented by adding several % to 30% of rhenium to tungsten. It is also possible to further restrain the drop in ductility by forming a film structure which is difficult to recrystallize. The film structure which is difficult to recrystallize is a structure made up of fine crystal grains. To form such a film, the hydrogen reduction method showed the best results.

For lower production cost, the intermediate layer and the generating layer are preferably formed continuously in the same reactor. According to the present invention, a reactor is used which is equipped with both a chloride generating device (that is, a chlorinating oven) and a fluoride supply line to allow a continuous coating.

Preferably, the rhenium intermediate layer having an equiaxed structure should have an average grain size in the range of 10-50 microns to achieve optimum results. Similarly, the thickness of this intermediate layer should be about 10-50 microns to achieve the best results.

As described above, according to the present invention, a rhenium film having an equiaxed grain structure is used as the diffusion shield. Thus, the mutual diffusion between the tungsten and the graphite substrate is restrained and the X-ray generating intensity can be kept high for a prolonged period of time. Also, the method according to the present invention is suitable for manufacturing the above-described rotary anode with low manufacturing cost. Thus a high-output X-ray source can be manufactured which is useful for improving the accuracy of industrial X-ray analyzers as well as medical ones.

Other features and objects of the present invention will become apparent from the following description taken with reference to the accompanying drawings, in which:

BRIEF DESCRIPTION OF THE DRAWINGS

FIG. 3 is an explanatory view showing the relation between the deposition temperature and the film obtained.

DETAILED DESCRIPTION OF THE PREFERRED EMBODIMENT

Example 1

Figure 1:
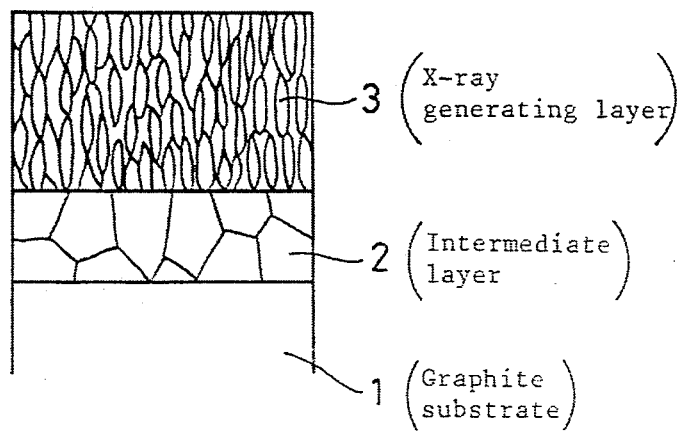
FIG. 1 is a schematic view of the rotary anode according to the present invention showing how the substrate is coated with the X-ray generating layer and the intermediate layer.
Figure 2:
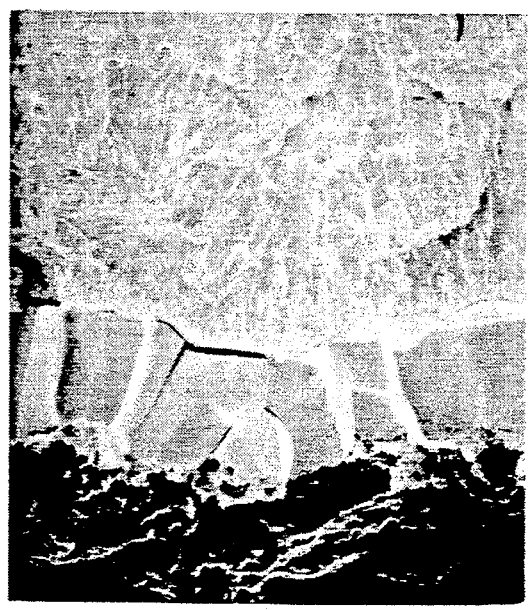
FIG. 2 is a scanning electron microscopic photograph of the rotary anode according to the present invention showing how the substrate is coated with the X-ray generating layer and the intermediate layer.

We examined the structures of the rhenium films obtained by subjecting a rhenium chloride to the thermal decomposition CVD process under different rhenium film forming conditions. In this test, films were formed to a thickness of 30 microns with the gas conditions constant and the temperature varied around the substrate temperature at the time of deposition. Also, as comparative examples, we formed rhenium films by subjecting metallic chlorides and metallic fluorides to hydrogen reduction. The sectional structures were evaluated by observing the sections of the coated specimens through a scanning electron microscope (FIG. 2 shows a microscopic photo). The results are shown in Table 1.

As is apparent from Table 1, with the thermal decomposition CVD process for rhenium chloride, a fine film having an equiaxed grain structure was obtained at 1200° C. or more. On the other hand, with the hydrogen reduction of chloride, a powdery deposite was obtained at 1000° C. or more, while a rhenium film having a columnar structure was obtained at 1000° C. or less. With the method in which fluorides are subjected to hydrogen reduction, a powdery deposit was obtained at 700° C. or more while a rhenium film having a columnar structure was obtained at 700° C. or less. It was thus confirmed that the thermal decomposition CVD process for chloride is suitable for forming a rhenium film having an equiaxed grain structure at a temperature of 1200° C. or more.

EXAMPLE 2

A 500-micron thick tungsten coating was formed by subjecting metallic fluorides to hydrogen reduction on each of the rhenium coated specimens obtained in the Example 1. After annealing at a constant temperature of 1200° C. for 10 hours, they were examined to see how carbide layer grew in the tungsten film. The results are shown in Table 2.

As is apparent from Table 2, comparing those having columnar structures, the larger the crystal grains, the more slowly the tungsten carbide layer grows. Also, it is apparent that the tungsten carbide layer grows further slowly in a film having an equiaxed grain structure compared with a film having a columnar structure. Thus, it was confirmed that a rhenium film having an equiaxed grain structure is superior as the diffusion shield.

TABLE 1

| material gas | reaction method | deposition temp. (°C.) | film structure | crystal grain diameter (micron) |
|---|---|---|---|---|
| chloride | thermal decomposition process | 800 | columnar structure | 5 |
|  |  | 1000 | columnar structure | 8 |
|  |  | 1200 | equiaxed grain structure | 12 |
|  |  | 1400 | equiaxed grain structure | 16 |
| chloride | hydrogen reduction process | 800 | columnar structure | 4 |
|  |  | 1000 | powdery deposite | — |
|  |  | 1200 | powdery deposite | — |
| fluoride | hydrogen reduction process | 500 | columnar structure | 2 |
|  |  | 700 | powdery deposite | — |
|  |  | 900 | powdery deposite | — |

TABLE 2

| material gas | reaction method | film structure | crystal grain diameter (micron) | carbide layer thickness (micron) |
|---|---|---|---|---|
| fluoride | hydrogen reduction | columnar grain structure | 2 | 18 |
| chloride | process | columnar grain structure | 4 | 10 |
| chloride | thermal decomposition process | columnar grain structure | 5 | 9 |
|  |  | columnar grain structure | 8 | 5 |
|  |  | equiaxed grain structure | 12 | 3 |
|  |  | equiazed grain structure | 16 | 2 |

What is claimed is:

1. A rotary anode for use in an X-ray tube comprising a graphite substrate plate, an intermediate layer made of a metal that does not react with graphite, and an X-ray generating layer provided on said intermediate layer for generating X-rays when electron impact is applied thereto, characterized in that said intermediate layer is a rhenium film having an equiaxed grain structure and being free from a columnar grain structure, said rhenium film having an average grain size of about 10–50 microns, and wherein the thickness of the intermediate layer is in the range of about 10 to 50 microns.

2. A rotary anode for use in an X-ray tube comprising a graphite substrate plate, an intermediate layer which does not react with graphite and an X-ray generating layer provided on the intermediate layer for generating X-rays when electron impact is applied thereto, said intermediate layer having a thickness of about 10 to 50 microns and made of rhenium having an equiaxed grain structure which is free of a columnar grain structure, and having an average grain size of about 10 to 50 microns, said rotator anode being produced by forming, on a graphite substrate plate, an intermediate layer of rhenium by subjecting a metallic chloride to a thermal decomposition CVD process at a substrate temperature of 1200° C. or more, and forming, on said intermediate layer, an X-ray generating layer of tungsten or a tungsten-rhenium alloy by subjecting a metallic fluoride to a hydrogen reduction thermal CVD process.

* * * * *